(12) United States Patent
Nakano et al.

(10) Patent No.: US 7,309,900 B2
(45) Date of Patent: Dec. 18, 2007

(54) THIN-FILM TRANSISTOR FORMED ON INSULATING SUBSTRATE

(75) Inventors: Fumiki Nakano, Yokohama (JP);
Genshiro Kawachi, Yokohama (JP);
Yoshiaki Nakazaki, Yokohama (JP);
Shinzo Tsuboi, Yokohama (JP);
Takahiko Endo, Yokohama (JP);
Tomoya Kato, Yokohama (JP)

(73) Assignee: Advanced LCD Technologies Development Center Co., Ltd., Totsuka-ku (JP)

( * ) Notice: Subject to any disclaimer, the term of this patent is extended or adjusted under 35 U.S.C. 154(b) by 91 days.

(21) Appl. No.: 11/085,111

(22) Filed: Mar. 22, 2005

(65) Prior Publication Data

US 2005/0212063 A1 Sep. 29, 2005

(30) Foreign Application Priority Data

Mar. 23, 2004 (JP) ............................. 2004-085542

(51) Int. Cl.
*H01L 29/76* (2006.01)
(52) U.S. Cl. .................. 257/401; 257/409; 257/E29.12
(58) Field of Classification Search ................ 257/347, 257/401, E27.131, 409, E29.12
See application file for complete search history.

(56) References Cited

U.S. PATENT DOCUMENTS

| | | | | |
|---|---|---|---|---|
| 5,561,308 A | * | 10/1996 | Kamata et al. ............. 257/301 |
| 5,661,050 A | * | 8/1997 | den Boer et al. ............ 438/30 |
| 5,994,735 A | * | 11/1999 | Maeda et al. ............... 257/329 |
| 6,140,667 A | * | 10/2000 | Yamazaki et al. ............ 257/59 |
| 6,452,211 B1 | * | 9/2002 | Ohtani et al. ................ 257/64 |
| 6,559,906 B1 | * | 5/2003 | Kawachi et al. ............. 349/47 |
| 6,906,346 B2 | * | 6/2005 | Nishitani et al. ............. 257/70 |
| 7,038,278 B2 | * | 5/2006 | Tsujimura et al. .......... 257/350 |
| 2001/0017683 A1 | * | 8/2001 | Hiroki et al. ............... 349/138 |
| 2003/0184507 A1 | * | 10/2003 | Nakazaki ..................... 345/87 |

FOREIGN PATENT DOCUMENTS

| | | |
|---|---|---|
| JP | 10-223898 | 8/1998 |
| JP | 11-97697 | 4/1999 |

OTHER PUBLICATIONS

Wen-Yu Huang, et al., "Electrical Characteristics Study of Edgeless Structure on P-type Low Temperature Poly-Si TFT", Digest of Technical Papers, AM-LCD 01, The Japan Society of Applied Physics, 2001 International Workshop on Active-Matrix Liquid-Crystal Displays-TFT Technologies and Related Materials-, Jul. 11-13, 2001, 6 Pages.

* cited by examiner

*Primary Examiner*—Jerome Jackson
*Assistant Examiner*—Mohammad Timor Karimy
(74) *Attorney, Agent, or Firm*—Oblon, Spivak, McCelland, Maier & Neustadt, P.C.

(57) ABSTRACT

There is provided a thin-film transistor that is formed on an insulating substrate, is capable of a high-speed operation, has small non-uniformity among devices, is hardly susceptible to device destruction due to high voltage, and is free from the effect of a parasitic transistor that forms at an edge part of an Si island. The thin-film semiconductor device is formed using a thin-film semiconductor provided on the insulating substrate and includes a gate region for formation of a channel region through which a drain current flows. The gate region has a ring shape in plan on the insulating substrate. High concentration impurity-doped regions are dividedly provided on an inside and an outside of the ring-shaped gate region, and the channel region is formed of a plurality of fan-shaped semiconductor single-crystal portions.

9 Claims, 15 Drawing Sheets

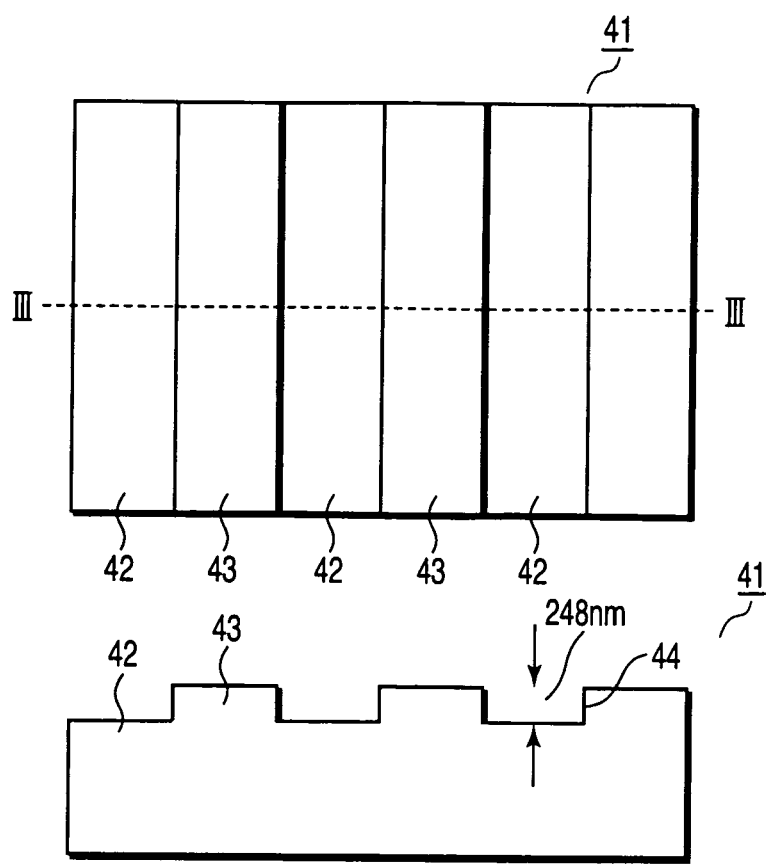
FIG. 3A
FIG. 3B
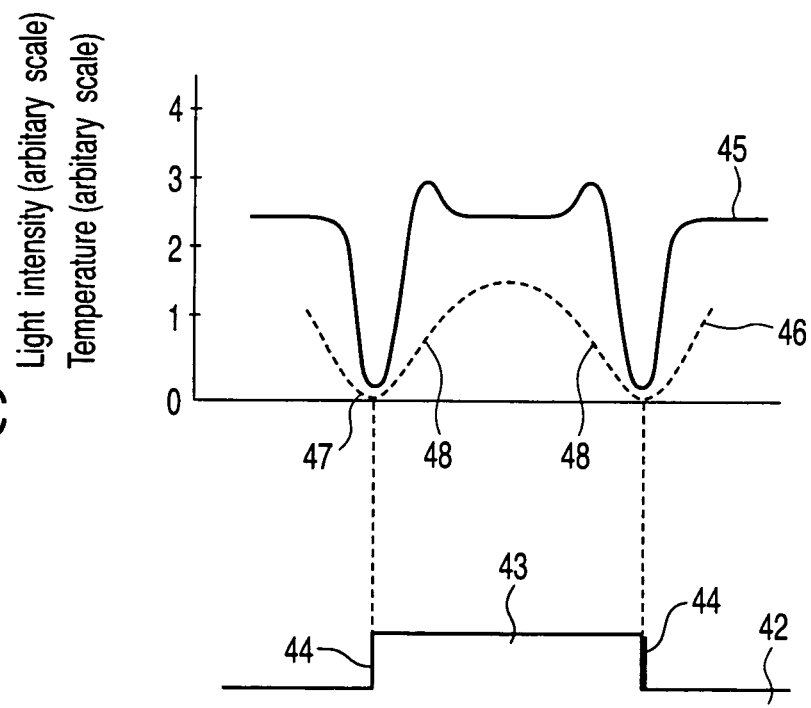
FIG. 3C
FIG. 3D

Channel length : 3 μm
Channel width : 28 μm

N-type ring-shaped gate TFT

Channel boron dose
① $2 \times 10^{15}$ [/cm$^3$]
② $1 \times 10^{16}$
③ $3 \times 10^{16}$
④ $5 \times 10^{16}$
⑤ $1 \times 10^{17}$ Channel length : 3 μm
Channel width : 5 μm Prior-art N-type TFT Channel boron dose
① $2 \times 10^{15}$ [/cm3]
② $1 \times 10^{16}$
③ $3 \times 10^{16}$
④ $5 \times 10^{16}$
⑤ $1 \times 10^{17}$

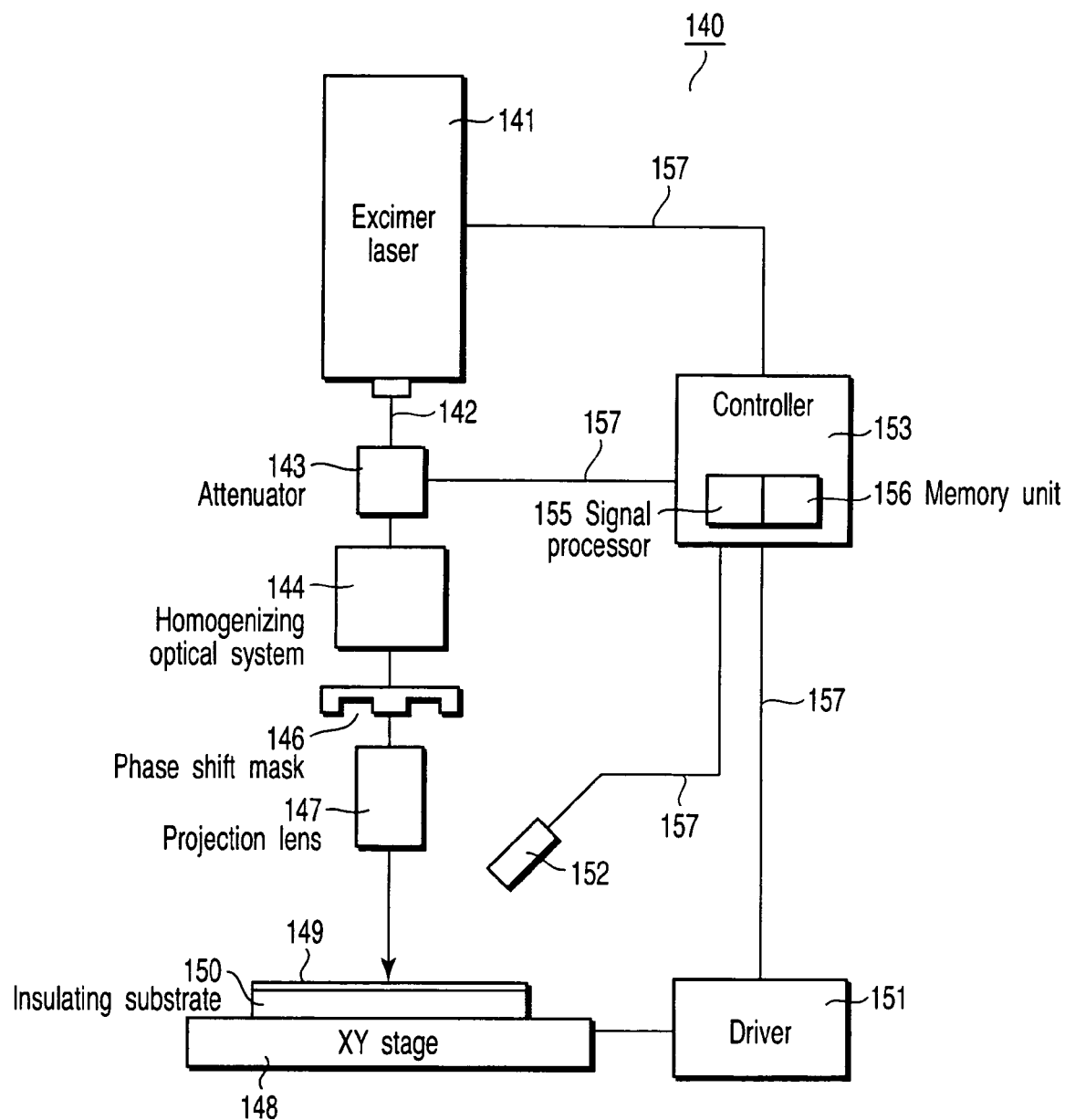
F I G. 16

THIN-FILM TRANSISTOR FORMED ON INSULATING SUBSTRATE

CROSS-REFERENCE TO RELATED APPLICATIONS

This application is based upon and claims the benefit of priority from prior Japanese Patent Application No. 2004-085542, filed Mar. 23, 2004, the entire contents of which are incorporated herein by reference.

BACKGROUND OF THE INVENTION

1. Field of the Invention

The present invention relates to a thin-film semiconductor device that is formed on a substrate with an insulating surface such as a glass substrate. In particular, the invention relates to a thin-film transistor with a high breakdown voltage, which is formed using a crystallized thin-film semiconductor formed on the substrate.

2. Description of the Related Art

In order to drive an active-matrix flat-panel display that is employed as a display for image information or text information, attention has been paid to the use of thin-film transistors (TFTs) that are formed on an insulating substrate. In addition, the thin-film transistors have been put to practical use as devices that constitute logic circuits, etc. in various types of electronic equipments.

FIG. 1A and FIG. 1B show an example of the thin-film transistor that has widely been put to practical use. FIG. 1A is a plan view, and FIG. 1B is a cross-sectional view taken along line I-I in FIG. 1A. As is shown in FIG. 1A and FIG. 1B, a thin-film transistor 10 is configured such that a semiconductor island 20 that is formed of, e.g. an amorphous silicon thin film is provided on an insulating substrate 11. A channel region 12 and source/drain regions 13, 14 are formed in the semiconductor island 20. A gate insulation film 15 and a gate electrode 16 are formed on the channel region 12. The source/drain regions 13, 14 are provided with source/drain electrodes 17, 18, and the source/drain regions 13, 14 are connected to other electronic devices by metal wires 19.

In the thin-film transistor 10 with the above-described structure, an electric field concentrates at an edge portion 23 between an upper surface 21 and a side surface 22 of the channel region 12, leading to a decrease in breakdown voltage of the thin-film transistor. Besides, with development in fine patterning technology, the effect of the side surface 22 of the channel region 12 has become unignorable. That is, there is a problem that substantially different field-effect transistors are formed in parallel at the upper surface 21 and side surface 22.

There is known a constitution wherein a ring-shaped gate structure is formed on a semiconductor single-crystal substrate. Jpn. Pat. Appln. KOKAI Publication No. 10-223898 (Reference Document 1), for instance, discloses the ring-shaped gate structure. With this structure, a device with a large gate width can be formed with a small occupation area. The increase in gate width can reduce the drain current density. Making use of this structure, an operation with a large current can be secured when a high voltage is applied, and breakdown voltage characteristics can be enhanced. Jpn. Pat. Appln. KOKAI Publication No. 11-97697 (Reference Document 2), for instance, discloses a ring-shaped gate structure relating to a thin-film transistor that is formed on an insulating substrate.

The ring-shaped gate MOSFET disclosed in Reference Document 1 is formed on the semiconductor single-crystal substrate. Thus, the channel region is formed on one single crystal without fail, and no crystal grain boundary is, in principle, present in the channel region. Therefore, the device characteristics are very stable, and non-uniformity in characteristics is considered to be small. However, at present, no method is known to form a single-crystal thin film over the entire surface of an inexpensive insulating substrate of, e.g. glass. In this situation, when a thin-film transistor is to be formed on an insulating substrate, an amorphous semiconductor thin film or a polycrystalline semiconductor thin film, which is formed on an insulating substrate, is used in usual cases.

Amorphous semiconductor thin films have widely been used since they can be formed at low temperatures and are suited to mass production. However, the mobility of carriers in the amorphous semiconductor thin film is considerably lower than that in the polycrystalline semiconductor thin film. It is thus difficult to achieve high-speed operations with the amorphous semiconductor thin film. For semiconductor devices that require high-speed operations, a polycrystalline semiconductor thin film, which is formed using a method such as a laser crystallization method, is used at present.

The polycrystalline semiconductor thin film that is formed by the laser crystallization method, however, has a very small crystal grain size, compared to the size of an operation region of the semiconductor device. Even if the transistor disclosed in Reference Document 2 is formed using the polycrystalline semiconductor thin film, a great number of crystal grain boundaries occur at random in the channel region of the transistor. The crystal grain boundaries function to prevent the flow of carriers. Consequently, the mobility of carriers in the channel region decreases, and a considerable non-uniformity occurs in electrical characteristics among devices.

The present invention aims at solving the above-described problems. Specifically, an object of the invention is to provide a thin-film transistor that is formed on an inexpensive insulating substrate such as a glass substrate, and is capable of high-speed operations and has small non-uniformity in characteristics among devices. Another object of the invention is to provide a thin-film transistor that is hardly susceptible to device destruction even if a high voltage is applied, and can have a sufficiently high breakdown voltage. Still another object of the invention is to provide a thin-film transistor that is free from the effect of a parasitic transistor that forms on a side wall of a Si (silicon) island.

BRIEF SUMMARY OF THE INVENTION

In order to achieve the above objects, the embodiments of the present invention may adopt, for example, the following means.

According to an embodiment of the present invention, there is provided a thin-film semiconductor device including: high concentration impurity-doped regions that are formed using a thin-film semiconductor provided on an insulating substrate, and constituting a source region and a drain region, which are connected to associated electrodes via contacts; and a gate that is formed in association with the high concentration impurity-doped regions, and forms a channel region through which a drain current flows between the high concentration impurity-doped regions, wherein the gate has a ring shape in plan on the insulating substrate, and the high concentration impurity-doped regions are dividedly provided on an inside and an outside of the ring-shaped gate, and the high concentration impurity-doped regions on the inside and outside of the ring-shaped gate and the channel region are formed of a plurality of radially extending fan-shaped semiconductor single-crystal portions.

With this structure, the probability is substantially zero that crystal grain boundaries, which extend in parallel to the inner and outer peripheries of the ring-shaped gate, are present in the channel region. Thus, there is substantially no grain boundary that hinders flow of electrons between the source and drain, and the high-speed operation is enabled. In addition, the non-uniformity in characteristics of devices, which results from non-uniformity in probability of presence of grain boundaries, is reduced. Moreover, with the adoption of the ring-shaped gate structure, the concentration of electric field at the gate region is suppressed, and the possibility of device destruction is reduced in the case of application of high voltage. Therefore, the breakdown voltage of the thin-film semiconductor device can be raised. Besides, since the gate electrode is not present at the edge part of the Si island, no parasitic transistor forms at the side wall of the Si island.

It was found that the fan-shaped semiconductor single-crystal region can be fabricated by a laser crystallizing method using, e.g. a phase shift mask. The applicant successfully fabricated, by this method, a substantially circular crystallized region comprising a plurality of single-crystal regions for formation of the thin-film transistor. The substantially circular crystallized region is formed of a plurality of fan-shaped single-crystal regions that have the same starting point of crystallization and have a radial length of, e.g. about 5 µm.

In addition, according to the invention, there is provided a thin-film semiconductor device of a MOSFET type, which is formed using a thin-film semiconductor provided on an insulating substrate. The thin-film semiconductor device includes a source region, a channel region and a drain region, which are adjacent to each other, wherein the channel region is formed of a plurality of single-crystal regions that extend from the source region to the drain region. Specifically, the invention may provide a thin-film semiconductor device of a MOSFET type, which is formed using a thin-film semiconductor provided on an insulating substrate, comprising: a source region; a channel region; and a drain region, the source region, the channel region and the drain region being adjacent to each other, wherein the channel region is formed of a plurality of single-crystal regions that extend radially from a central part of the thin-film semiconductor device and are defined by crystal grain boundaries.

BRIEF DESCRIPTION OF THE SEVERAL VIEWS OF THE DRAWING

The features and objects of the present invention, as well as the methods of implementing the invention, will be clear, and will be well understood, from the description given below of specific embodiments and the accompanying drawings.

FIG. 3A is a plan view that schematically shows a phase shift mask;

FIG. 3B is a cross-sectional view taken along line III-III in FIG. 3A;

FIG. 3C is a graph that shows an intensity distribution 45 of a laser beam, which has passed through the phase shift mask, and a temperature distribution 46 obtained by laser beam irradiation;

FIG. 3D is a cross-sectional view of a part of the phase shift mask corresponding to FIG. 3C;

FIG. 16 shows a crystallizing apparatus that is usable for recrystallization of the semiconductor thin film according to the present invention.

DETAILED DESCRIPTION OF THE INVENTION

Embodiments of the present invention will now be described with reference to the accompanying drawings.

First Embodiment

Figure 2A:
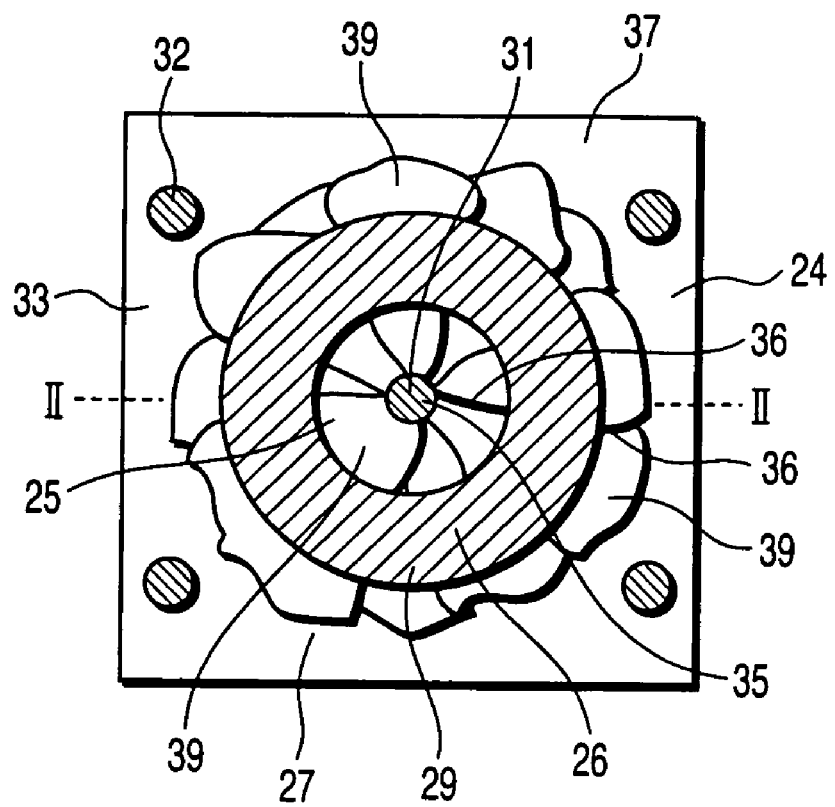
FIG. 2A is a plan view that shows the structure of a thin-film transistor according to the present invention.
Figure 2B:
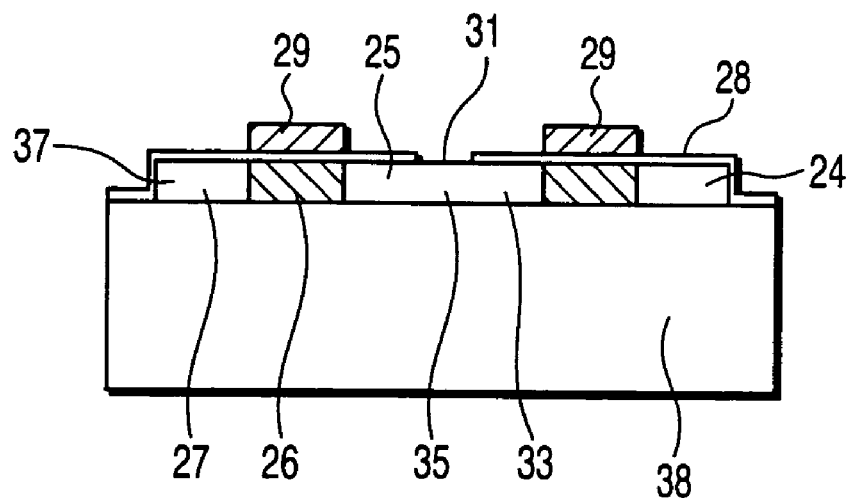
FIG. 2B is a cross-sectional view taken along II-II in FIG. 2A.

FIG. 2A and FIG. 2B show an example of the structure of a thin-film transistor according to a first embodiment of the present invention. FIG. 2A is a plan view and FIG. 2B is a cross-sectional view taken along line II-II in FIG. 2A.

As is shown in FIG. 2A and FIG. 2B, the thin-film transistor according to the first embodiment of the invention is formed on a semiconductor island 33 that is formed of a thin-film semiconductor 24 with a thickness of, e.g. 100 nm thick on an insulating substrate 38. A glass substrate, for instance, is used as the insulating substrate 38. In particular, it is preferable that a no-alkali glass substrate be used as the insulating substrate 38. It is also possible to use a quartz substrate or a plastic substrate, depending on necessity. For electrical isolation between neighboring devices, each thin-film semiconductor 24 is formed as a square thin-film semiconductor island 33 with a dimension of, e.g. 15 μm on each side. The shape of the semiconductor island 33, however, is not limited to the square, and it may be circular. In the present embodiment, the semiconductor thin film is preferably formed of silicon, but other semiconductor materials such as Group III-V semiconductor elements may be used.

The semiconductor island 33 has, in its major central region, a substantially circular crystallized region that is formed of a plurality of fan-shaped single-crystal regions 39. Within the semiconductor island 33, a source region 25, a ring-shaped channel region 26 and a ring-shaped drain region 27 are concentrically formed adjacent to each other in the named order from a central part 35 toward the peripheral side. In this case, it is desirable that at least the entirety of the channel region 26 be formed within the crystallized region that is formed of the plural fan-shaped single-crystal regions 39. The channel region 26 is formed of the single-crystal regions that extend from the source region 25 to the drain region 27. The channel region 26 is normally doped with phosphorus (in the case of a PMOS transistor) or boron (in the case of an NMOS transistor) with a concentration of $10^{16}/cm^3$ to $10^{17}/cm^3$. In the first embodiment shown in FIG. 2A and FIG. 2B, the inside part of the channel region 26 is formed as the source region 25, and the outside part of the channel region 26 is formed as the drain region 27. Alternatively, the inside part of the ring-shaped channel region 26 may be formed as a drain region and the outside part of the channel region 26 may be formed as a source region in a ring shape.

A gate electrode 29, which has a ring-shaped structure, is formed on the channel region 26 via a gate insulation film 28 with a thickness of, e.g. 30 nm. In the first embodiment shown in FIG. 2A, the gate electrode 29 is formed along a circular ring-shaped pattern. The gate electrode 29 has an outside diameter of, e.g. 5 μm and an inside diameter of, e.g. 3 μm. In this description, the shape of the gate electrode is expressed as "ring-shaped shape". The ring-shaped shape, however, is not limited to the circular shape, and may be an elliptical strip shape or a polygonal strip shape such as a rectangular or hexagonal shape.

The source region 25 and drain region 27 are connected to a source electrode and a drain electrode (not shown) via contact holes 31 and 32 each having a diameter of, e.g. 1 μm and penetrating an interlayer insulation film (not shown). As the contact hole for the source region 25, a single source contact hole 31 is provided substantially at the central part 35 of the source region 25 in the embodiment shown in FIG. 2A and FIG. 2B. On the other hand, as the contact holes for the drain region 27, four contact holes 32 are provided at substantially regular intervals along the gate electrode 29 and equidistantly from the contact hole 31 of the source region in the embodiment shown in FIG. 2A and FIG. 2B. In order to obtain good ohmic contact between the contact holes and the source region 25 and drain region 27 serving as contact electrodes, high-concentration impurities are doped in the source region 25 and drain region 27. Specifically, the source region 25 and drain region 27 are doped with boron (in the case of a PMOS transistor) or phosphorus (in the case of an NMOS transistor) with a concentration of about $10^{20}/cm^3$.

The operation of the MOSFET in the first embodiment of the invention is described referring to FIG. 2A and FIG. 2B. The operational principle of this MOSFET is the same as that of a conventional MOSFET. In the state in which a predetermined operational voltage is applied between the source electrode and the drain electrode, if a predetermined voltage is not applied to the gate electrode 29 or a voltage less than a threshold is applied to the gate electrode 29, a current path between the source region 25 and drain region 27 is cut off. On the other hand, in the state in which a predetermined operational voltage is applied between the source electrode and the drain electrode, if a predetermined voltage is applied to the gate electrode 29, a channel is formed along the ring-shaped gate in the thin-film semiconductor part under the gate electrode 29 that is provided between the source region 25 and the drain region 27, that is, in the channel region 26. Thus, a drain current flows between the source region 25 and drain region 27 via the channel 26. In the thin-film transistor of this invention, a current flows through the channel region 26 in a radial fashion from the inside source region 25 of the ring-shaped gate electrode 29 to the outside drain region 27 of the ring-shaped gate electrode 29 so as to cross the ring-shaped part.

In the present invention, as shown in FIG. 2A, a plurality of single-crystal regions 39, each of which has a large grain size and extends from the central part 35 of the semiconductor island in a fan shape, are used. Thus, crystal grain boundaries 36 between the respective single-crystal regions 39 are radially formed from the central part 35. Accordingly, the channel region 26 is formed in a plurality of single-crystal regions that are defined by the crystal grain boundaries that radially extend from the central part 35. With this structure, in the channel region 26, substantially no crystal grain boundaries are present in a direction perpendicular to the direction in which the drain current flows. Therefore, the mobility of carriers is not decreased due to grain boundaries, and a high-speed operation can be performed. Moreover, non-uniformity in characteristics of devices, which results from non-uniformity in probability of presence of grain boundaries, is reduced.

Figure 8A:
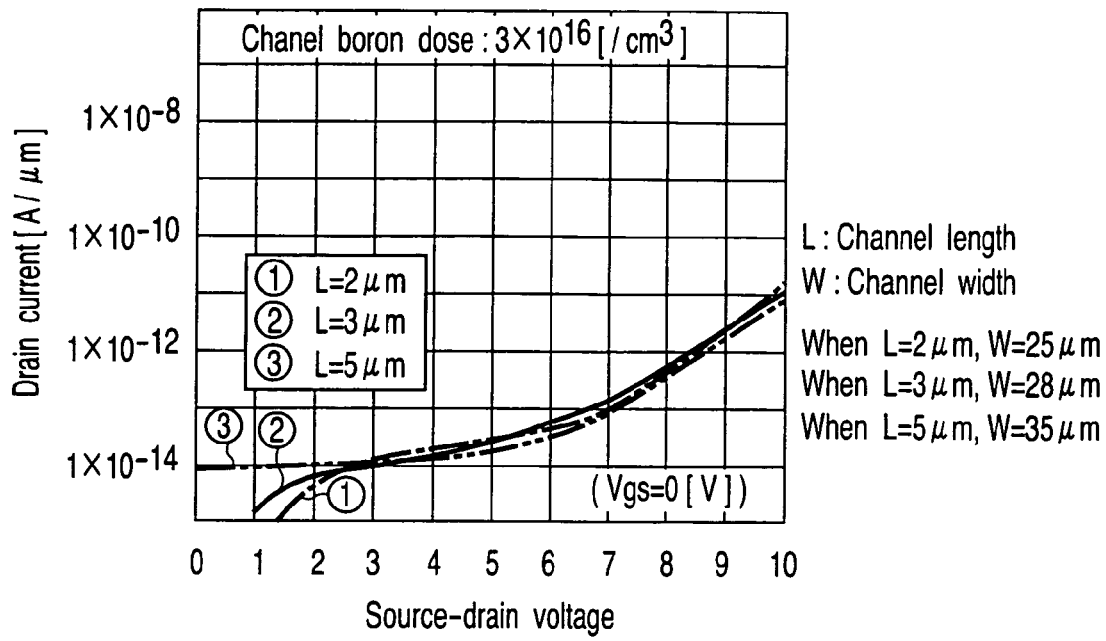
FIG. 8A is a graph showing a source-drain breakdown voltage of the ring-shaped gate thin-film transistor according to the invention shown in FIG. 6A.

With the adoption of the ring-shaped gate electrode 29, the gate width can be increased. As a result, the current density in the channel region 26 that is formed along the ring-shaped gate region 29 can be reduced. Furthermore, as shown in FIG. 8A, the breakdown voltage between the source and drain can be improved.

Formation of Plural Fan-Shaped Single-Crystal Regions

By a method that is to be described below, for example, the thin-film transistor of the present invention is formed in the semiconductor island 33 that includes a plurality of fan-shaped single-crystal regions 39. According to this method, a plurality of semiconductor islands each with a plurality of fan-shaped parts, which are formed of substantially single-crystal regions and are needed for the channel region 26, can uniformly be formed on the entire insulating substrate. Japanese Patent Application No. 2003-209598, which was filed on Aug. 29, 2003 by the applicant of this application, discloses the basic principle for obtaining such a plurality of single-crystal semiconductor regions at predetermined regions of the insulating substrate.

In the case where the substrate that is used as the substrate 38 of the thin-film transistor is a glass substrate, high temperatures that can be used, for example, in drawing a silicon ingot cannot be used in order to form a single crystal. At first, an amorphous silicon thin film with a predetermined thickness, for instance, is uniformly formed on the glass substrate 38 by a proper method. Subsequently, a pulse-like ultraviolet laser beam is applied to the amorphous silicon thin film, thereby melting the amorphous silicon thin film. Then, the molten silicon is recrystallized, and a silicon thin film that is partially made into a single crystal is obtained. In the description below, silicon is used. However, the semiconductor material is not limited to silicon. The semiconductor island 33 is formed by etching away the peripheral thin-film portion.

In one method of recrystallization, which aims at obtaining a largest possible single-crystal region, a thin film is melted while a temperature gradient is given to respective semiconductor island parts 33. Then, the temperature of the substrate is decreased while the temperature gradient is being kept, and thus recrystallization is effected. To achieve this, a phase shift mask with a proper pattern is used to provide a spatial distribution to the intensity of a laser beam that is applied to the surface of the semiconductor thin film. Thereby, a temperature gradient is provided in the radial direction from a predetermined central part. With this method, even after the irradiation of the laser beam, the temperatures of the respective parts of the substrate decrease on the basis of the temperature gradient at the time of melting, and crystal growth in the lateral direction occurs successively from the lowest-temperature part toward the high-temperature part. Thus, from the initially produced polycrystalline portion, crystal growth progresses with a seed of crystal portion that is particularly suited to crystal growth, and a plurality of large fan-shaped single-crystal regions that extend radially can be obtained.

Next, the basic principle of the recrystallization step based on the temperature gradient using the phase shift mask is described referring to FIGS. 3A and 3B. A phase shift mask 41 shown in FIG. 3A and FIG. 3B is configured such that a transparent medium, such as a quartz medium, is provided with mutually adjacent regions 42 and 43 with different thicknesses. At a stepped boundary portion 44 (phase shift portion) between the regions shown in FIG. 3B, diffraction or interference occurs between incident laser beams. In this manner, a cyclic spatial distribution is imparted to the intensity of the incident laser beam.

The phase shift mask 41 in this example is so configured as to have adjacent patterns with opposite phases (180° phase difference). Specifically, alternately arranged regions comprise a first strip region 42 with a phase π and a second strip region 43 with a phase 0. Each strip region (phase shift line region) has a width of 10 µm in this example. To be more specific, the phase shift mask 41 is fabricated by pattern-etching a rectangular quarts plate with a refractive index of 1.5 so as to have a depth corresponding to a phase π relative to light with a wavelength of 248 nm, that is, a depth of 248 nm. The region that is thinned by etching becomes the first strip region 42, and the non-etched region becomes the second strip region 43.

When the phase shift mask 41 with this structure is used, a laser beam that has passed through the thick second phase region 43 delays by 180°, relative to a laser beam that has passed through the thin first phase region 42. As a result, interference and diffraction occur between laser beams. A laser beam intensity distribution 45, as shown in FIG. 3C, is obtained. Specifically, since laser beams that have passed through adjacent phase regions have opposite phases, a laser beam that has passed through the phase shift portion between the adjacent phase regions has a minimum light intensity, for example, 0. The temperature of the portion with the minimum light intensity decreases to the minimum, and a cyclic temperature distribution 46 is provided on the substrate surface.

When the irradiation of the laser beam is stopped, a minimum-temperature region 47 or a region near the region 47 has a temperature of a melting point or lower, and a great number of polycrystals that are nuclei for semiconductor recrystallization occur in the region. At first, polycrystals are produced in the minimum-temperature region 47. However, while crystals are grown in succession in accordance with the temperature gradient, a crystal portion with a crystal orientation, which is particularly suitable for crystal growth, grows and a plurality of relatively large single-crystal regions are obtained at each temperature gradient portion 48.

In the above description, the phase shift mask 41 is configured to have mutually parallel, linear phase shift portions, as shown in FIG. 3C. However, in order to obtain a plurality of fan-shaped single-crystal regions that are formed cyclically on the plane, as in the thin-film transistor of the present invention, it is necessary to form portions, which become starting points of growth and have a laser beam intensity of 0, at predetermined cycles in dot shapes with a two-dimensional distribution.

One method for this is described. For example, the phase shift amount of each of perpendicularly crossing phase shift lines is set at less than 180°. In this case, at the position corresponding to each phase shift line, the light intensity decreases but does not completely become 0. However, by properly choosing the shift amount, as described below, the sum of complex transmittance in the vicinity of the intersection of the phase shift lines can be reduced to 0. In this case, the light intensity at the intersection can be reduced to 0.

Figure 4A:
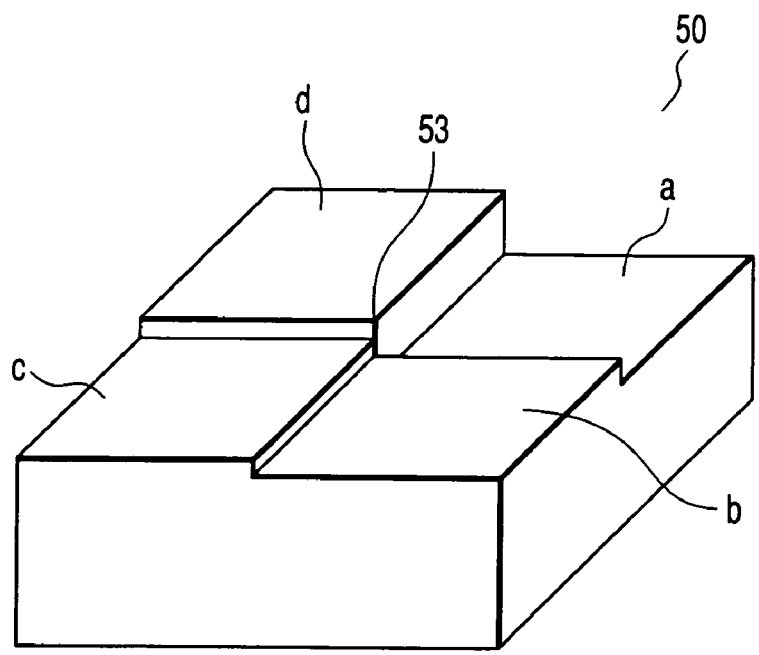
FIG. 4A shows an example of a phase shift mask that is usable in order to cyclically form dot-like low-temperature parts on a semiconductor thin film, and specifically illustrates a unit mask comprising four square regions a, b, c and d.
Figure 4B:
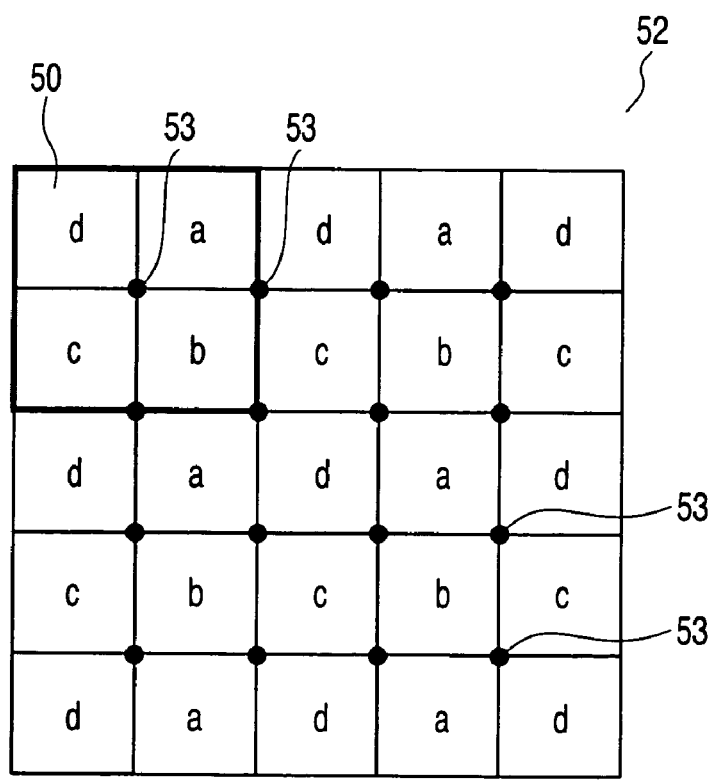
FIG. 4B is a plan view that schematically shows the phase shift mask that is formed by combining a plurality of unit masks shown in FIG. 4A.

An example is described referring to FIG. 4A and FIG. 4B. A phase shift mask 52 includes a plurality of square patterns 50 each comprising four square regions a, b, c and d, which have different thicknesses, as shown in FIG. 4A and FIG. 4B. In each pattern, as shown in FIG. 4A, the first region a is the thinnest and has a phase 0. The fourth region d is the thickest and has a phase that shifts from the phase of the first region a by $3\pi/2$. The second and third regions b and c have thicknesses between the thicknesses of the first and fourth regions a and d and have phases that shift from the phase of the first region a by $\pi/2$ and $\pi$, respectively.

In the above-described mask, a center point 53 of the square pattern, at which the first to fourth regions adjoin, has an intensity 0. Therefore, this center point becomes a lowest-temperature part and a nucleus of crystal growth. In FIG. 4B, the center point of the patterns, a, b, c, d, that is, each lattice point 53, can be set to have the intensity 0. Therefore, the lattice point can be set as the central position of formation of each fan-shaped single-crystal region. At an intermediate part between the lattice points, that is, at a peripheral part 37 of the semiconductor island 33 in the case of FIG. 2, a plurality of single-crystal regions, which have grown from the neighboring lattice points, collide with each other and become a polycrystal region. The polycrystal region, however, is doped with high-concentration impurities as the drain region, and no problem arises with electrical characteristics.

Figure 5A:
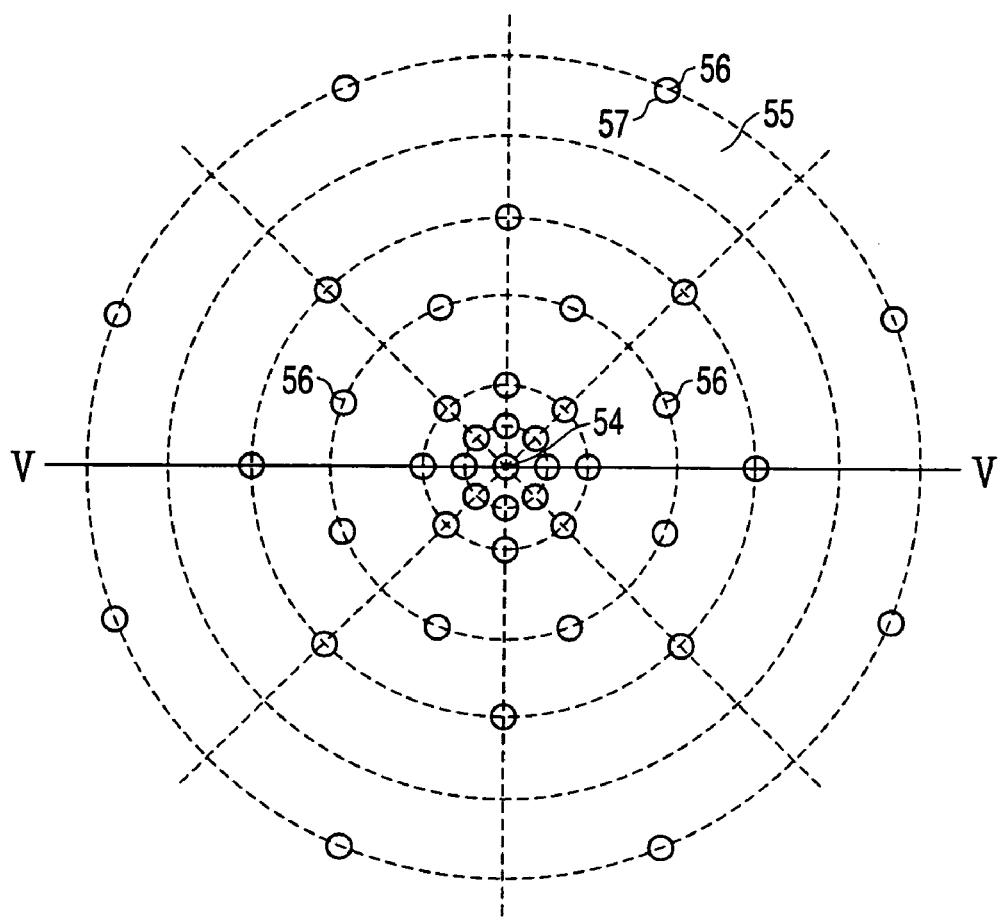
FIG. 5A is a plan view that schematically shows another phase shift mask that is usable in order to form dot-like low-temperature parts.

FIG. 5A shows a part of another embodiment of the phase shift mask, which is configured to have a lowest temperature at a central part 54 thereof. The part of the phase shift mask, which is shown in FIG. 5A, is formed such that a transparent substrate 55 such as a quartz substrate is provided with small circular regions 56 with different thicknesses. In the example of FIG. 5A, the regions 56 with different thicknesses are circular. However, the shape is not limited to the circular shape, and may be a square, rectangular, polygonal or elliptical shape. The sizes and/or shapes of the regions 56 may be varied from location to location within the mask. The thickness of the small regions 56 is selected, relative to the thickness of the substrate 55, such that transmissive light has a phase difference of 180° in relation to the part of the substrate 55. In circular stepped portions 57 (phase shift portions), incident laser beams are diffracted or interfered. Thus, the incident laser beams interfere with each other at the stepped portions 57, and the intensity of the emitted laser beams decreases.

Figure 5B:
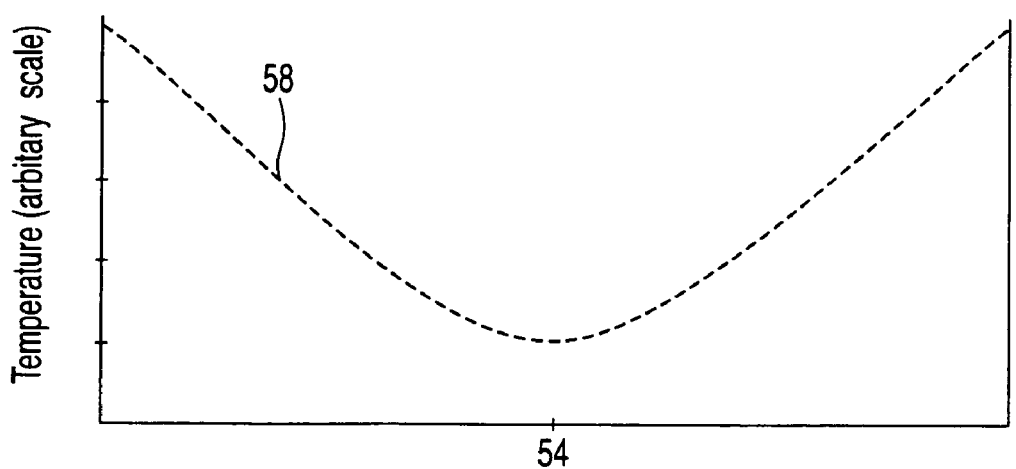
FIG. 5B is a cross-sectional view taken along line V-V in FIG. 5A.

In order to minimize the heating temperature of the laser beam at the central part 54 in FIG. 5A, the regions 56 with opposite phases are distributed such that the number of regions 56 gradually increases toward the center of the central part 54. FIG. 5B schematically shows a temperature distribution 58 along line V-V in FIG. 5A. Since the temperatures are averaged, it is possible to provide such a temperature distribution 58 that the temperature takes a minimum value at the central part 54 and gradually increases toward the peripheral part. By adjusting the distribution in position of the regions 56, the temperature distribution can desirably be adjusted. With this temperature distribution, the semiconductor thin film is recrystallized and, hence, a plurality of single-crystal fan-shaped regions, which radially extend from the central part 54, can be formed. A great number of such lowest-temperature parts 54 are cyclically formed. Thereby, a great number of lowest-temperature parts 54 are formed, for example, in a lattice fashion. Thus, a great number of thin-film transistor formation regions can be formed in a lattice fashion.

FIG. 16 shows an embodiment of a crystallizing apparatus 140 that is usable in the recrystallization of the semiconductor thin film according to the present invention. In this example, an excimer laser 141 (e.g. XeCl, KrF, etc.) is used as a laser light source. The laser light source, however, is not limited to such an excimer laser. As is shown in FIG. 16, on the emission side of the excimer laser 141 that emits a pulse laser beam 142, there are successively provided an attenuator 143 for controlling the energy density of the laser beam 142 and a homogenizing optical system 144 for homogenizing the intensity of the laser beam. The attenuator 143 and homogenizing optical system 144 are ordinary ones that are used in conventional optical apparatuses. A phase shift mask 146 is disposed on the emission side of the homogenizing optical system 144. A laser beam pattern, which is formed by the phase shift mask 146, is passed through a projection lens 147 with an unchanged size or with a reduced size.

An XY stage 148 that is movable in a direction perpendicular to the direction of travel of the laser beam is disposed on the emission side of the projection lens 147. An insulating substrate 150, on which a semiconductor thin film 149 is formed, is to be placed on the XY stage 148. The XY stage 148 is connected to a driver 151 and is moved by the driver 151 in a direction perpendicular to the direction of the laser beam. A light receiving device 152 for detecting the position of the semiconductor thin film 149 is provided above the XY stage 148.

The excimer laser 141, attenuator 143, driver 151 and light receiving device 152 are electrically connected to a controller 153 over signal lines 157. The controller 153 includes a signal processor 155 that processes signals from these components 141, 143, 151 and 152 and generates necessary control signals for the components, and a memory unit 156 that stores information and programs, which are necessary for signal processing. The controller 153 includes a program that enables formation of recrystallized regions with large grain sizes in the amorphous or polycrystalline semiconductor thin film 149 by means of excimer laser irradiation. The controller 153 can execute various controls that are necessary for the recrystallizing apparatus, including a light emission control of the excimer laser 141 that emits a pulse laser beam, an energy density control of the attenuator 143, a driving control of the XY stage 148 by means of the driver 151, and a position detection control for the semiconductor thin film 149 by means of the light receiving device 152.

Figure 6A:
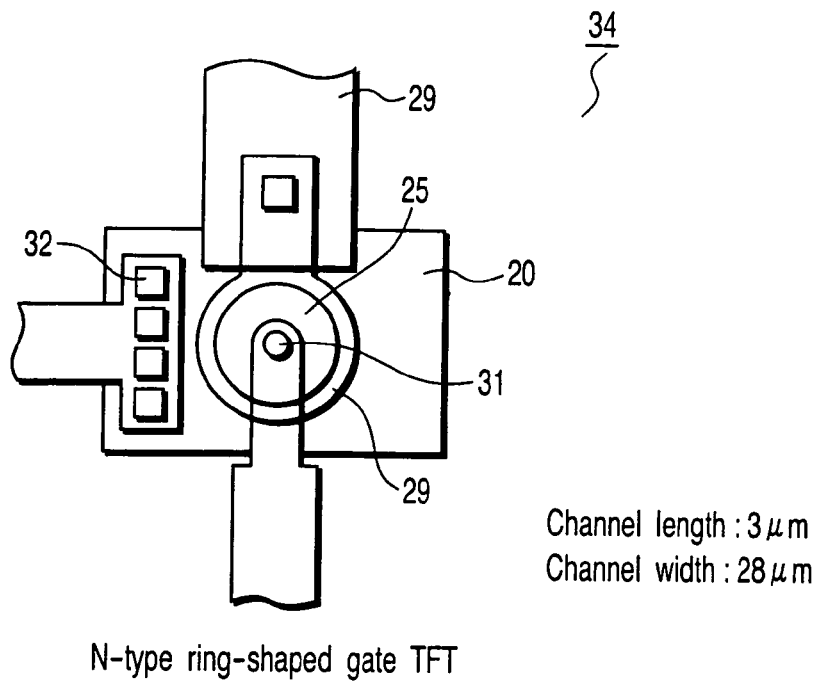
FIG. 6A shows an N-type ring-shaped gate thin-film transistor that is experimentally fabricated in the present invention.
Figure 6B:
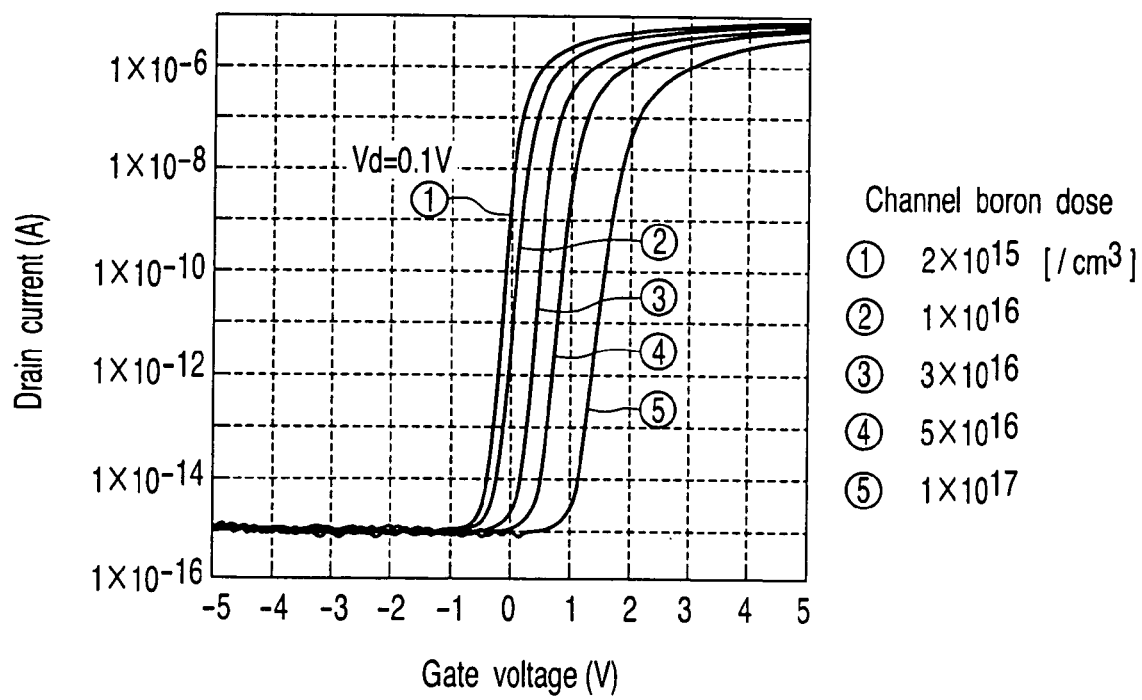
FIG. 6B is a graph showing drain current versus gate voltage characteristics of the N-type ring-shaped gate thin-film transistor shown in FIG. 6A.

FIG. 6B shows actual measurement results of electrical characteristics of a ring-shaped gate thin-film transistor 34 that is thus obtained. FIG. 6A is a schematic view of the experimentally fabricated N-type ring-shaped gate thin-film transistor 34. FIG. 6B is a graph showing drain current versus gate voltage characteristics of this transistor. The channel length (in the radial direction) of the ring-shaped gate is 3 µm, and the channel width (in the circumferential direction) thereof is 28 µm. The measurement results relate to cases where the dose of boron in the channel region is variously set at $2\times10^{15}/cm^3$, $1\times10^{16}/cm^3$, $3\times10^{16}/cm^3$, $5\times10^{16}/cm^3$, and $1\times10^{17}/cm^3$.

Figure 1A:
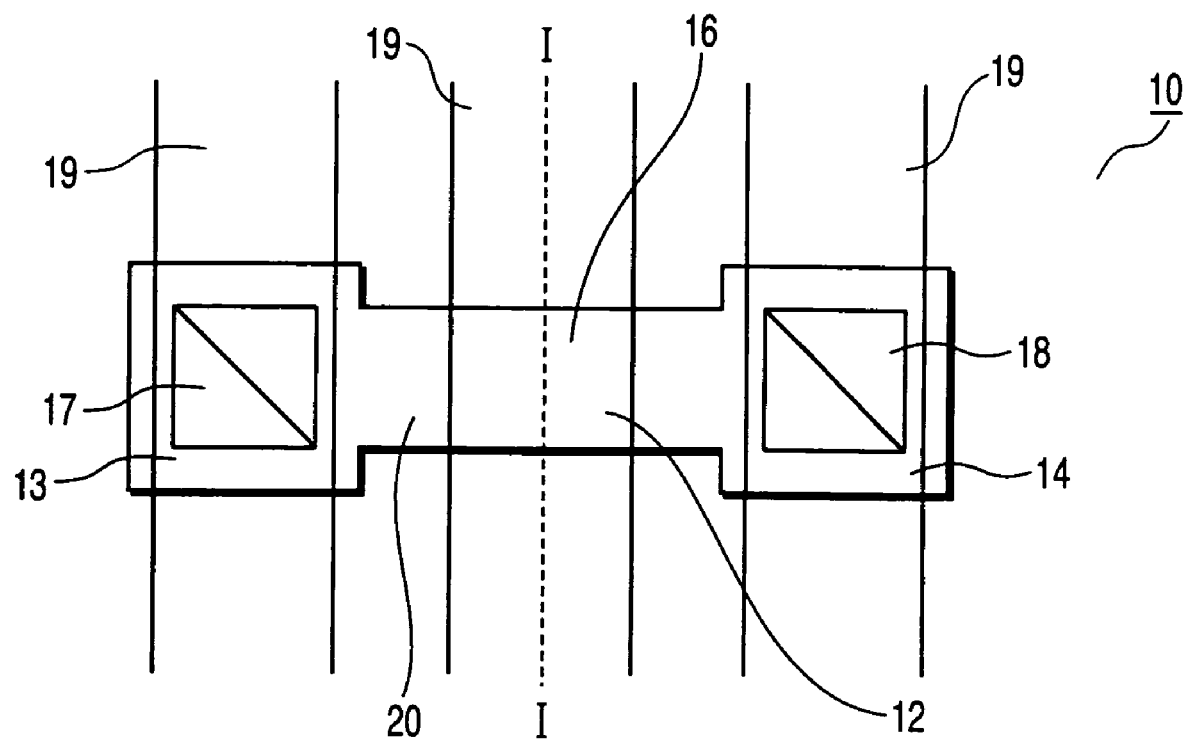
FIG. 1A is a plan view that shows the structure of a prior-art thin-film transistor 10.
Figure 1B:
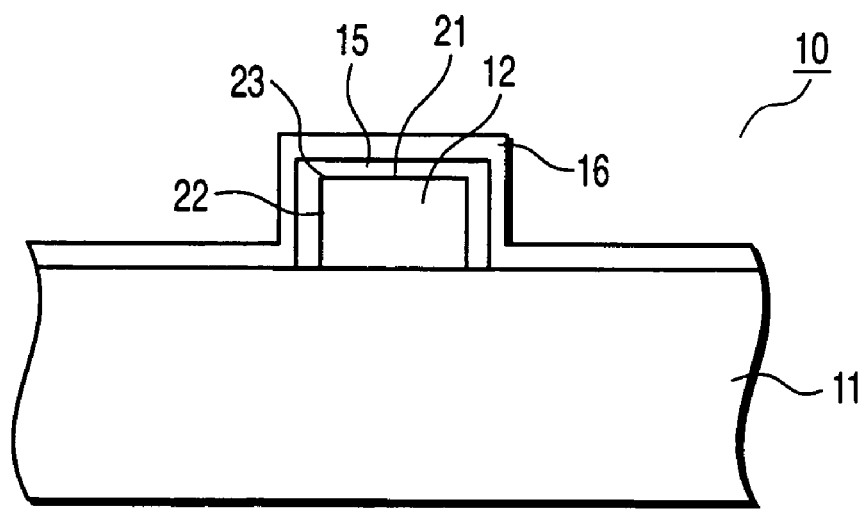
FIG. 1B is a cross-sectional view of the prior-art thin-film transistor 10, taken along line I-I in FIG. 1A.
Figure 7A:
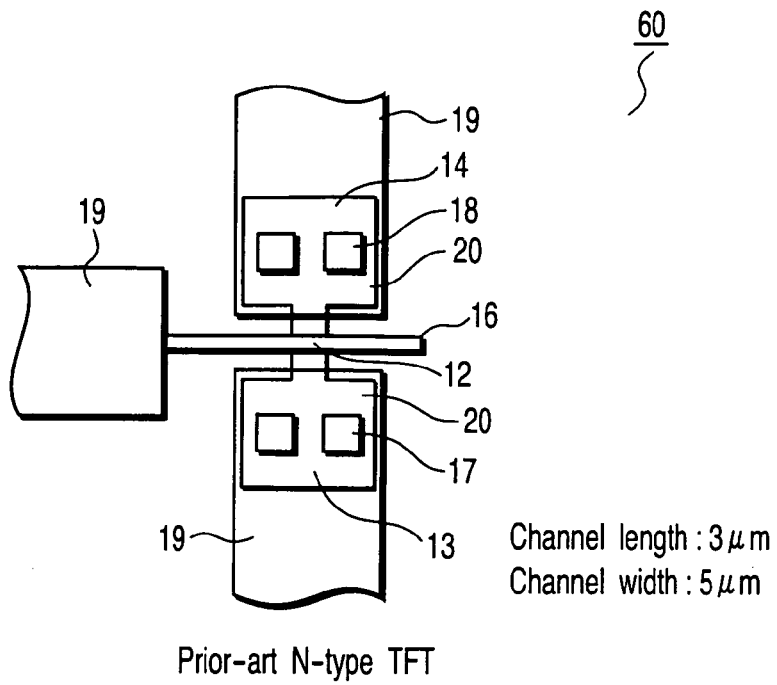
FIG. 7A is a plan view that schematically shows a prior-art thin-film transistor 60.
Figure 7B:
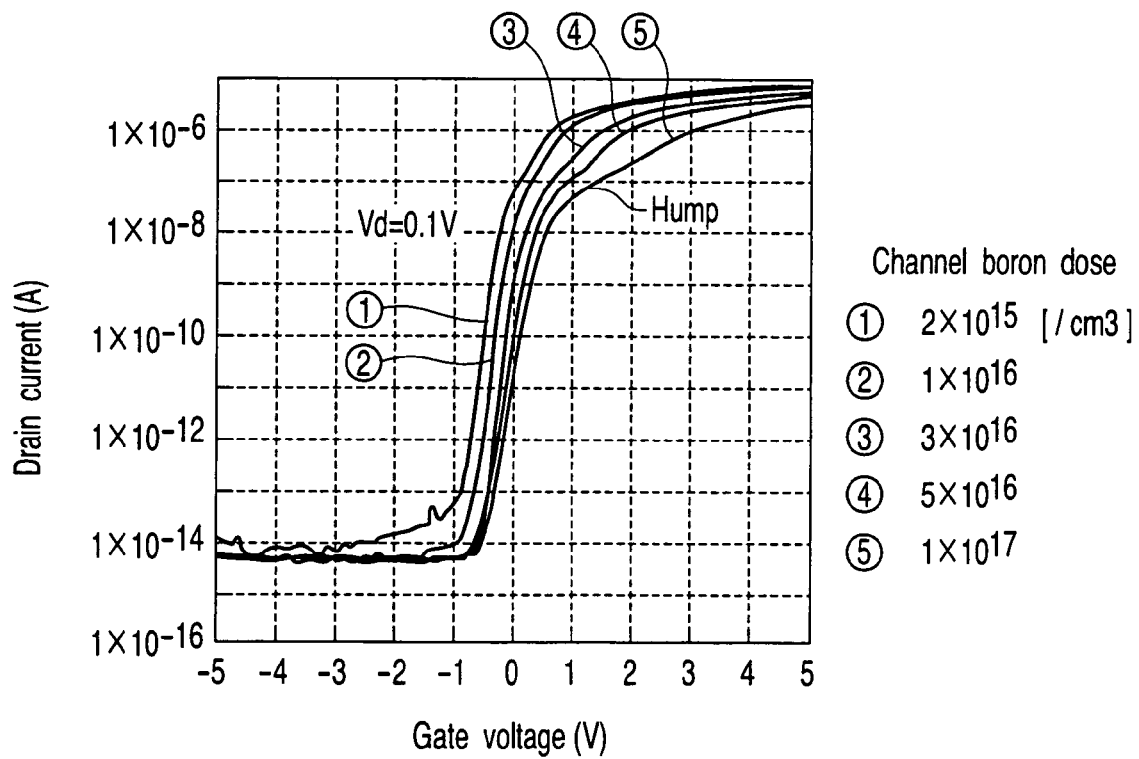
FIG. 7B is a graph showing drain current versus gate voltage characteristics that were actually measured in connection with the prior-art thin-film transistor shown in FIG. 7A.

FIG. 7A and FIG. 7B are views for explaining actual measurement results of electrical characteristics of a prior-art N-type thin-film transistor 60, as shown in FIG. 1, which was experimentally fabricated for the purpose of comparison. FIG. 7A is a schematic view of the thin-film transistor 60. FIG. 7B is a graph showing drain current versus gate voltage characteristics of this transistor. In FIG. 7A, a silicon thin-film semiconductor island 20 includes a channel region 12, a source region 13, a drain region 14 and a gate electrode 16. The source and drain regions 13 and 14 are provided with a source electrode 17 and a drain electrode 18. The respective electrodes are connected to a lead-out wire 19. FIG. 7B shows the drain current versus gate voltage characteristics of this transistor. Like the case of the present invention, these characteristics are measurement results relating to cases where the dose of boron in the channel region is variously set at $2\times10^{15}/cm^3$, $1\times10^{16}/cm^3$, $3\times10^{16}/cm^3$, $5\times10^{16}/cm^3$, and $1\times10^{17}/cm^3$.

In the characteristics of the prior-art N-type thin-film transistor, as shown in FIG. 7B, humps appear due to the effect of a parasitic transistor that forms on the side wall of the Si island. By contrast, sharp characteristics are obtained with the ring-shaped gate thin-film transistor of the present invention, as shown in FIG. 6A and FIG. 6B.

Figure 8B:
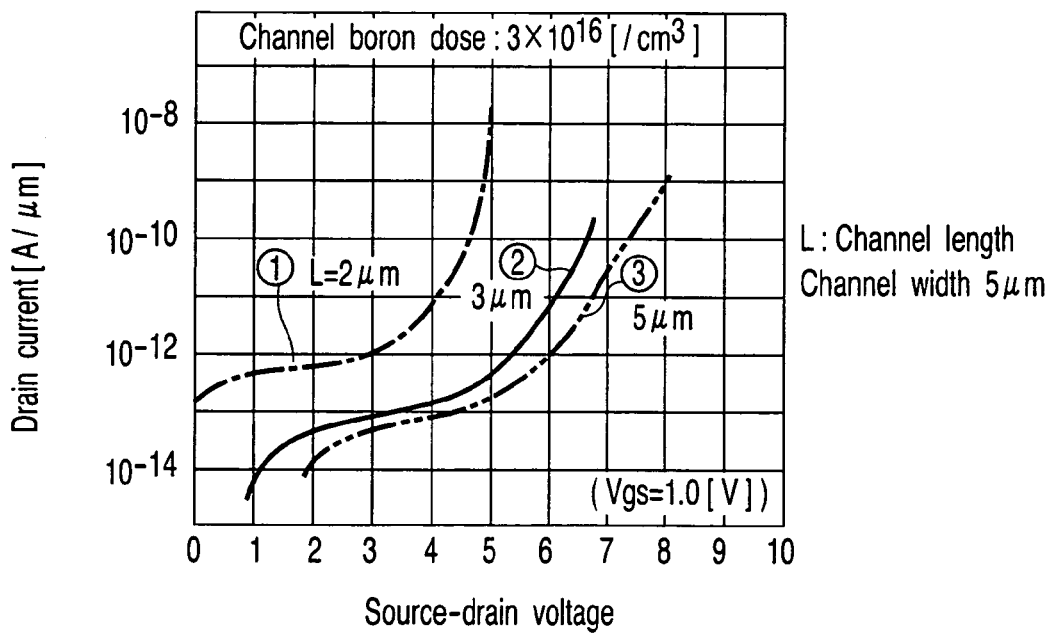
FIG. 8B is a graph showing a source-drain breakdown voltage of the prior-art thin-film transistor shown in FIG. 7A.

FIG. 8A is a graph showing a source-drain breakdown voltage of the N-type ring-shaped gate thin-film transistor shown in FIG. 6A, and FIG. 8B is a graph showing a source-drain breakdown voltage of the conventional N-type thin-film transistor 60 shown in FIG. 7A. In the characteristics of the conventional N-type thin-film transistor, the drain current sharply increases when the source-drain voltage is about 5 V to 8 V. Compared to this, it is understood that the ring-shaped gate thin-film transistor of the present invention has excellent breakdown voltage characteristics.

Second Embodiment

Figure 9A:
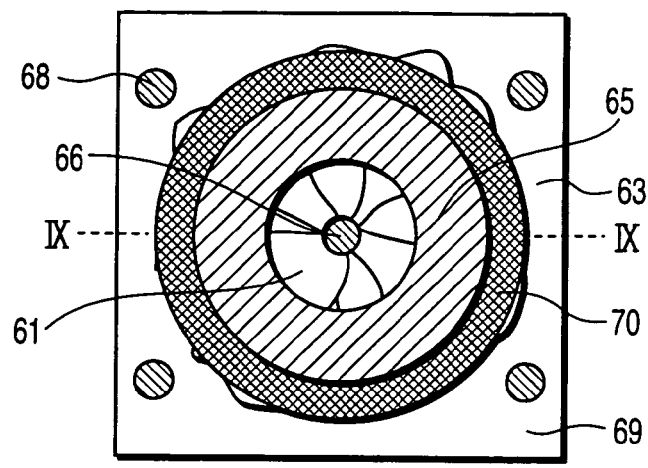
FIG. 9A is a plan view that shows the structure of a second embodiment of the invention, in which an offset region is provided between a drain region and a channel region.
Figure 9B:
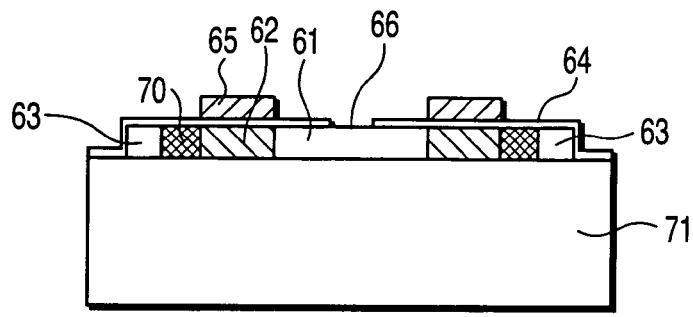
FIG. 9B is a cross-sectional view taken along line IX-IX in FIG. 9A.

FIG. 9A is a plan view that shows the structure of a second embodiment of the invention, and FIG. 9B is a cross-sectional view taken along line IX-IX in FIG. 9A. Like the structure shown in FIG. 2A, a semiconductor island 69 on an insulating substrate 71 is provided with a source region 61, a channel region 62, a drain region 63, a gate insulation film 64, a gate electrode 65, a source contact hole 66 and drain contact holes 68.

In the thin-film transistor shown in FIG. 2A, the channel region is doped with phosphorus (in the case of a PMOS transistor) or boron (in the case of an NMOS transistor) with a concentration of $10^{16}/cm^3$ to $10^{17}/cm^3$. In the second embodiment, an offset region 70, which has the same impurity concentration as the channel region, is provided between the drain region 63 and the channel region 62. The presence of the offset region 70 facilitates extension of a depletion layer in this region, and thus an increase in electric field at the end of the drain is alleviated. Therefore, a further improvement can be achieved with respect to the source-drain breakdown voltage.

Third Embodiment

Figure 10A:
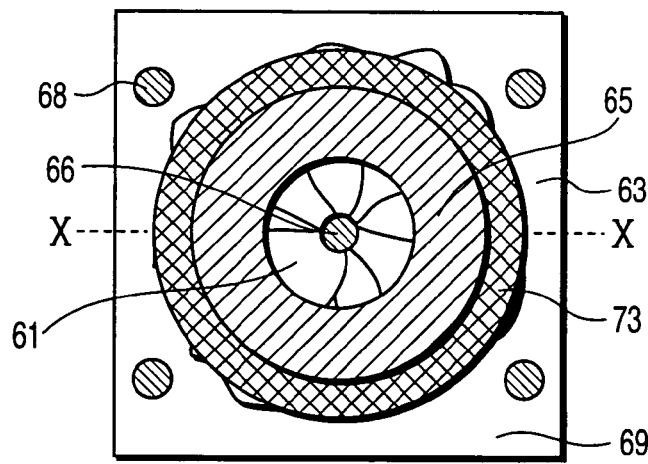
FIG. 10A is a plan view that shows the structure of a third embodiment of the invention, in which an LDD region is provided between a drain region and a channel region.
Figure 10B:
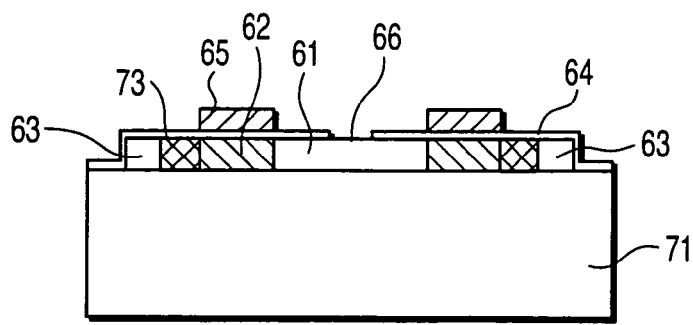
FIG. 10B is a cross-sectional view taken along line X-X in FIG. 10A.

FIG. 10A is a plan view that shows the structure of a third embodiment of the invention, and FIG. 10B is a cross-sectional view taken along line X-X in FIG. 10A.

Like the structure shown in FIG. 9A, a semiconductor island 69 on an insulating substrate 71 is provided with a source region 61, a channel region 62, a drain region 63, a gate insulation film 64, a gate electrode 65, a source contact hole 66 and drain contact holes 68.

The thin-film transistor shown in FIG. 10A differs from the thin-film transistor shown in FIG. 2A in that an LDD (lightly doped drain) region 73 is provided between the drain region 63 and the channel region 62. The LDD region 73 is doped with impurities with a concentration that is lower than the concentration in the drain region 63 and is higher than the concentration in the channel region 62. The LDD region 73 is doped with the same kind of impurities as in the drain region with a concentration of $10^{18}/cm^3$. The presence of the LDD region 73 facilitates extension of a depletion layer in this region, and thus an increase in electric field at the end of the drain is suppressed. Therefore, a further improvement can be realized with respect to the source-drain breakdown voltage.

Fourth Embodiment

Figure 11A:
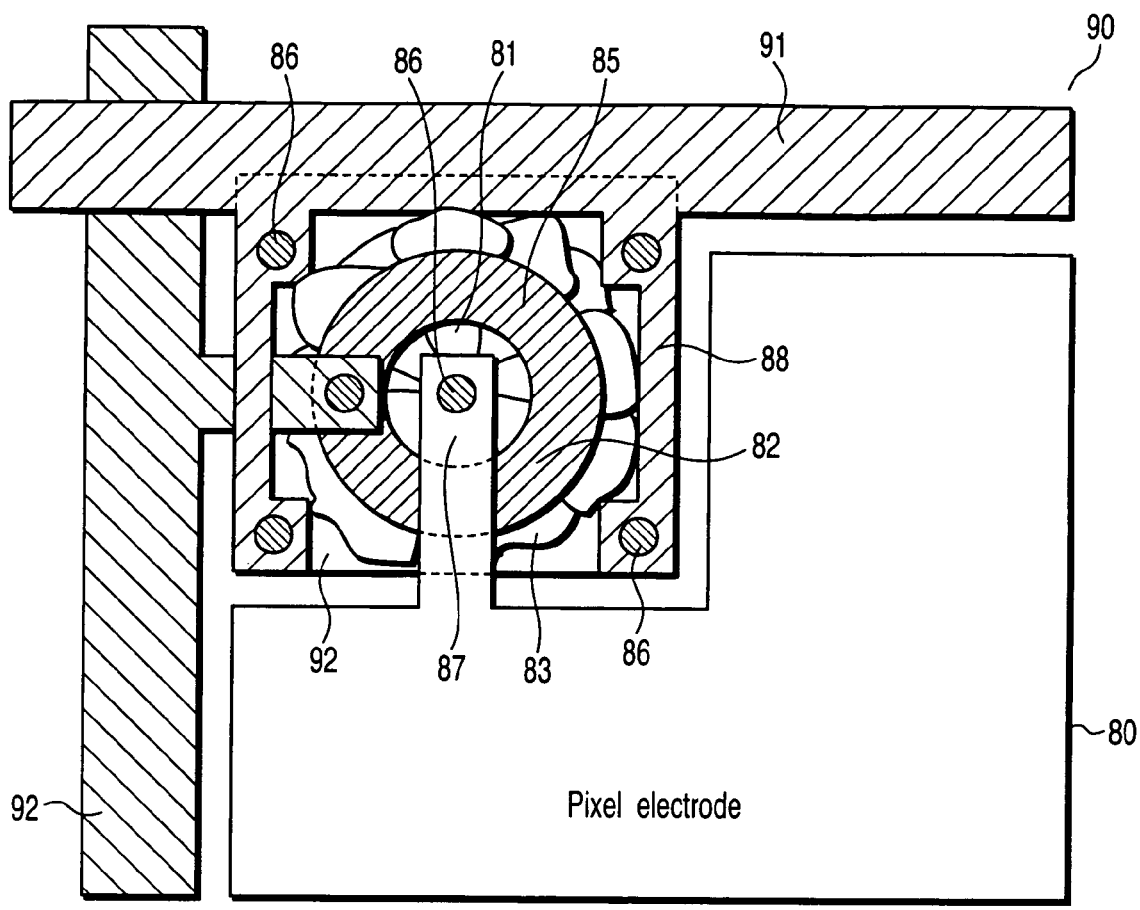
FIG. 11A shows an example in which the ring-shaped gate thin-film transistor according to the present invention is used as a pixel switching element of a display device such as an LCD display.
Figure 11B:
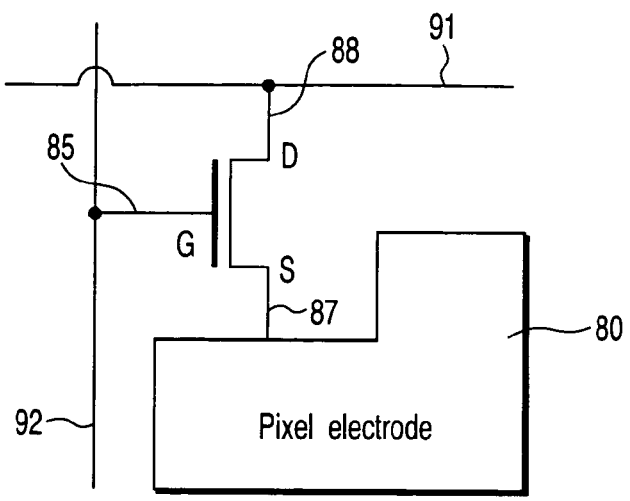
FIG. 11B is a circuit diagram of the structure shown in FIG. 11A.

FIG. 11A shows an example in which the ring-shaped gate thin-film transistor according to the present invention is used as a pixel switching element of a display device such as an LCD display. A plurality of pixel electrodes 80 of the display device and a plurality of semiconductor islands, which are associated with the pixels, are provided on an insulating substrate 90. FIG. 11A shows only one of the pixels. The semiconductor island is provided with a source region 81, a channel region 82, a drain region 83, a gate insulation film (not shown), a gate electrode 85, contact holes 86, a source electrode 87, and a drain electrode 88. The source electrode 87 is connected to the pixel electrode 80. The drain electrode 88 is connected to a drain driver line 91. The gate electrode 85 is connected to a gate driver line 92. FIG. 11B is a circuit diagram of the structure shown in FIG. 11A.

In general, in order to drive a liquid crystal, it is necessary to apply a voltage of about +15 V to the drain. In the case of a transistor with a low breakdown voltage, the transistor may be damaged. In the semiconductor device of the present invention, the breakdown voltage is raised by increasing the gate width with use of the ring-shaped gate, as described above. Therefore, the semiconductor device is advantageously protected against damage.

Fifth Embodiment

Figure 12:
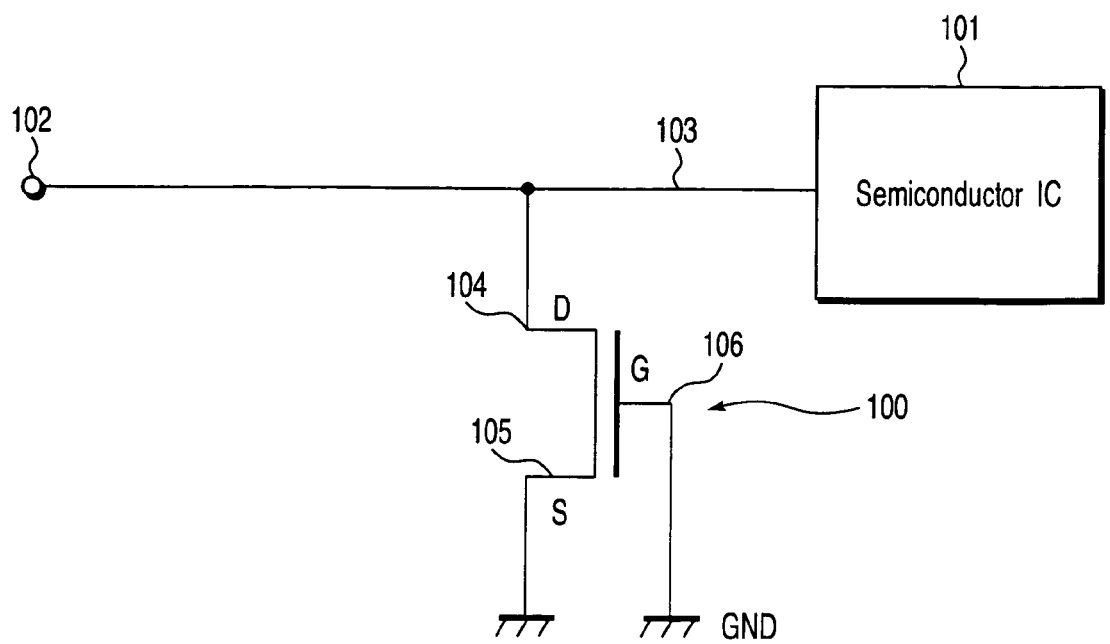
FIG. 12 is a circuit diagram of an example in which the ring-shaped gate thin-film transistor according to the present invention is used as a protection device for an internal circuit of a semiconductor integrated circuit.

FIG. 12 shows an example in which a ring-shaped gate thin-film transistor 100, as shown in FIG. 2, 9, or 10, is connected to an input/output terminal 102 of a semiconductor integrated circuit 101 and is used as a protection device for an internal circuit (not shown) of the semiconductor integrated circuit 101. The input/output terminal 102 of the semiconductor integrated circuit 101 is connected to the internal circuit over a line 103. The ring-shaped thin-film transistor 100 that functions as a protection device is connected over the line 103 to the input/output terminal 102, thereby constituting a bias path for protecting the internal circuit from a surge current that flows at the input/output terminal 102 due to electrostatic discharge, etc.

The ring-shaped gate thin-film transistor 100 according to this invention has a drain 104 connected to the line 103, and a source 105 and a gate 106 that are grounded. Thus, when a signal, whose voltage is less than a breakdown voltage, is input to the input/output terminal 102, the signal at the input/output terminal 102 is normally supplied to the internal circuit, since the current path between the source 105 and drain 104 is kept in the off-state and the ring-shaped gate thin-film transistor 100 does not function as the bias path. On the other hand, when a surge current, whose voltage exceeds the breakdown voltage, is input to the input/output terminal 102, the current path between the source and drain of the transistor 100 is rendered conductive and functions as the bias path for the internal circuit. Therefore, the input of surge current to the internal circuit can be suppressed, and the internal circuit is protected against large current.

When a high voltage is applied while this protection device is functioning as the bias path, a large current flows through the protection device and the protection device itself may be destroyed. According to the ring-shaped gate thin-film transistor 100 of the present invention, however, the breakdown voltage is raised by increasing the gate width with use of the ring-shaped gate, as described above. Therefore, the ring-shaped gate thin-film transistor 100 itself is not destroyed and the internal circuit is advantageously protected.

Sixth Embodiment

Figure 13A:
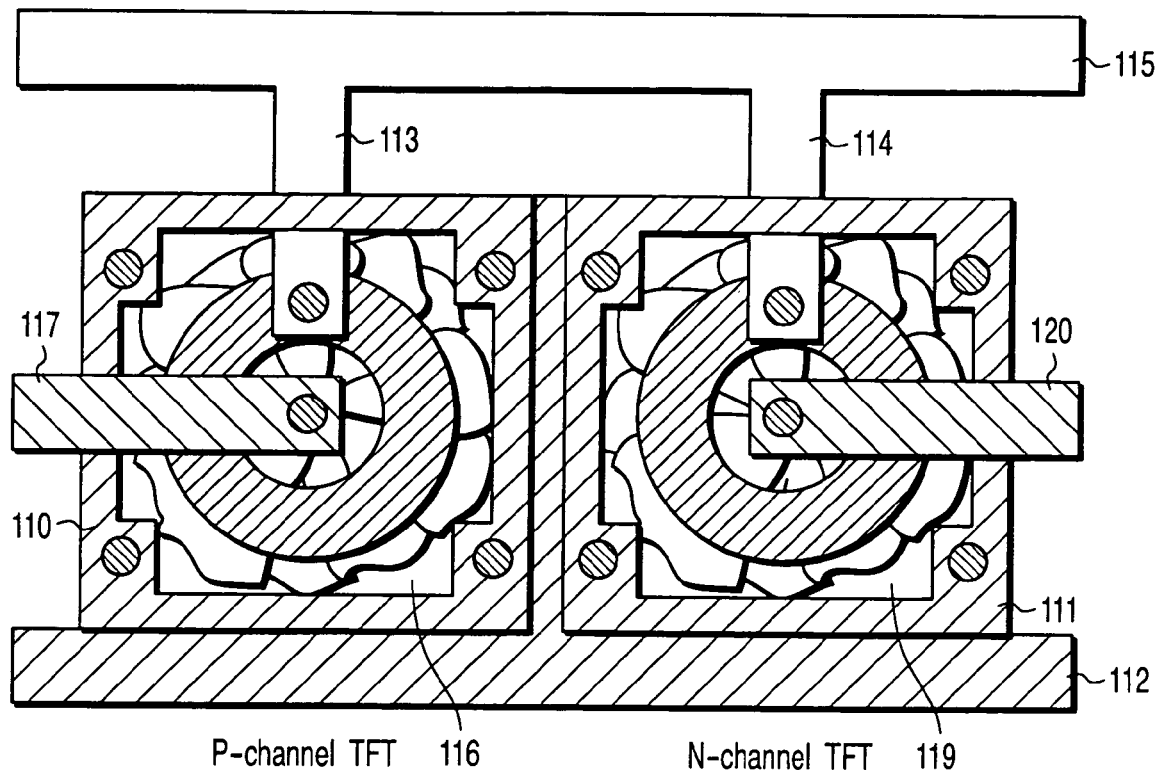
FIG. 13A shows an example in which the ring-shaped gate thin-film transistor according to the present invention is applied to a buffer CMOS inverter.
Figure 13B:
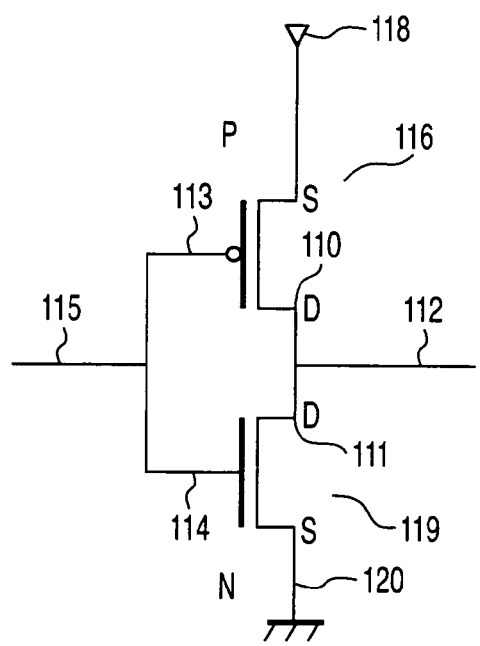
FIG. 13B is a circuit diagram of the structure shown in FIG. 13A.

FIG. 13A and FIG. 13B show an example in which the ring-shaped gate thin-film transistor, as shown in FIGS. 2A and 2B, FIGS. 9A and 9B or FIGS. 10A and 10B, is applied to a buffer CMOS inverter that is formed by combining a PMOSFET and an NMOSFET. FIG. 13A is a plan view and FIG. 13B is a circuit diagram. In the semiconductor device comprising the buffer CMOS inverter shown in FIGS. 13A and 13B, both MOSFETs 116 and 119 are configured, like the prior-art CMOS inverter, to have their drains 110 and 111 connected to an output terminal 112 and to have their gates 113 and 114 connected to an input terminal 115. A drive voltage 118 is applied to a source 117 of the PMOSFET 116, and a source 120 of the NMOSFET 119 is grounded. In the CMOS inverter, a current amplification operation can be achieved in accordance with the ratio between the gate width and the gate length. The semiconductor device comprising the CMOS inverter according to this invention can attain a high current amplification factor.

Seventh Embodiment

Figure 14:
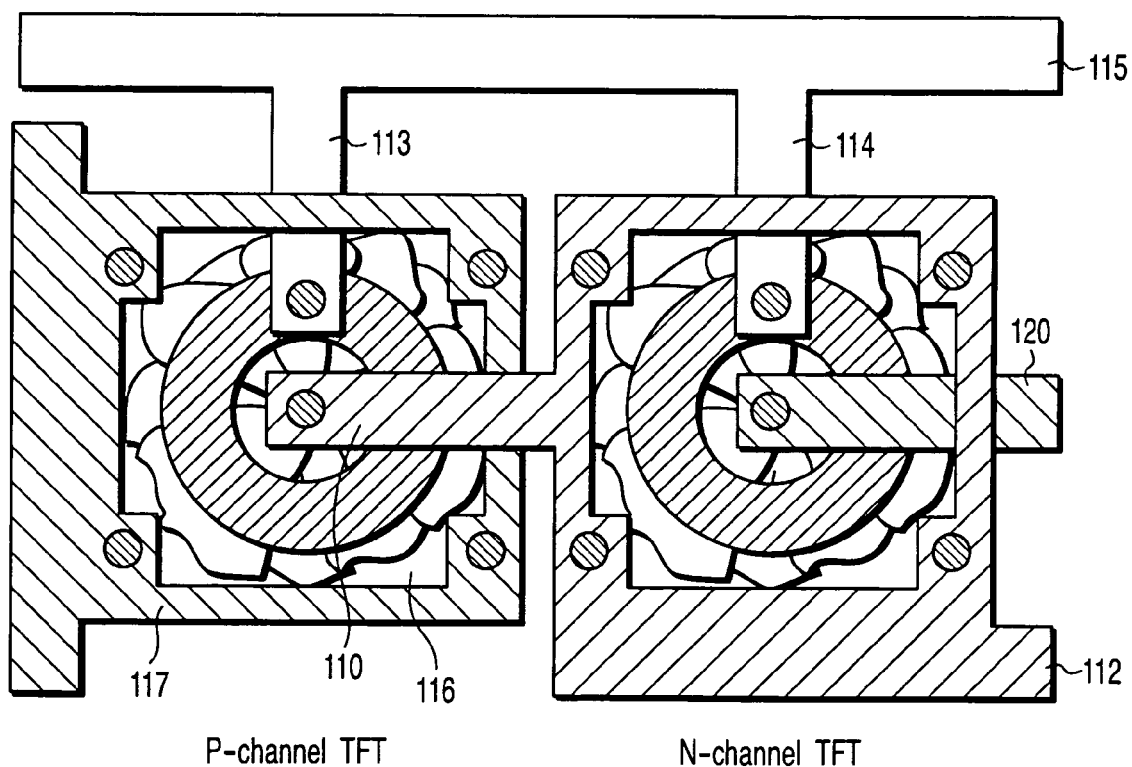
FIG. 14 shows a modification of the buffer CMOS inverter shown in FIG. 13, in which a central region of the PMOSFET is formed as a drain region and a peripheral part thereof is formed as a source region.

FIG. 14 shows an example in which the PMOSFET 116 of the buffer CMOS inverter shown in FIGS. 13A and 13B is modified such that the central region, inside the ring-shaped gate, is formed as the drain region 110, and the peripheral part is formed as the source region 117.

Eighth Embodiment

Figure 15:
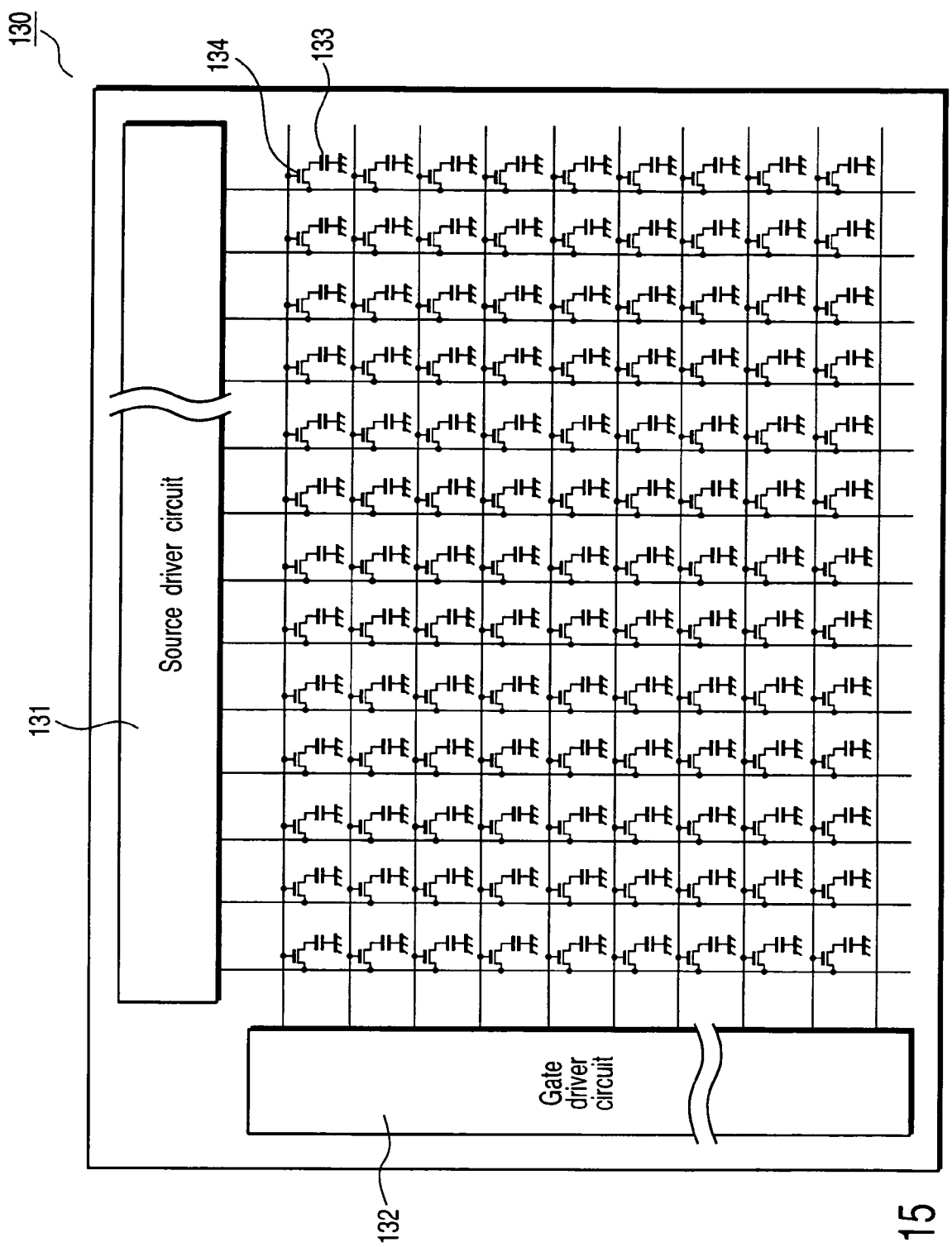
FIG. 15 shows an example in which the ring-shaped gate thin-film transistor according to the present invention is used for pixel control in a display apparatus.

FIG. 15 shows an example of a display device 130 using the ring-shaped gate thin-film transistors according to the present invention. The CMOS inverter shown in FIGS. 13A and 13B or FIG. 14 can advantageously be applied to a source driver circuit 131 and a gate driver circuit 132 shown in FIG. 15. Reference numeral 133 denotes pixels, and numeral 134 designates transistors that control the pixels. The transistors 134 may be formed using the ring-shaped gate thin-film transistors as shown in FIGS. 2A and 2B, FIGS. 9A and 9B and FIGS. 10A and 10B.

Ninth Embodiment

The thin-film transistor according to the first embodiment employs a thin-film semiconductor such as a silicon thin film, which is formed on an insulating substrate such as a no-alkali glass substrate. However, the present invention is not limited to the use of the substrate in which the insulating substrate and the thin-film semiconductor are combined.

Figure 17:
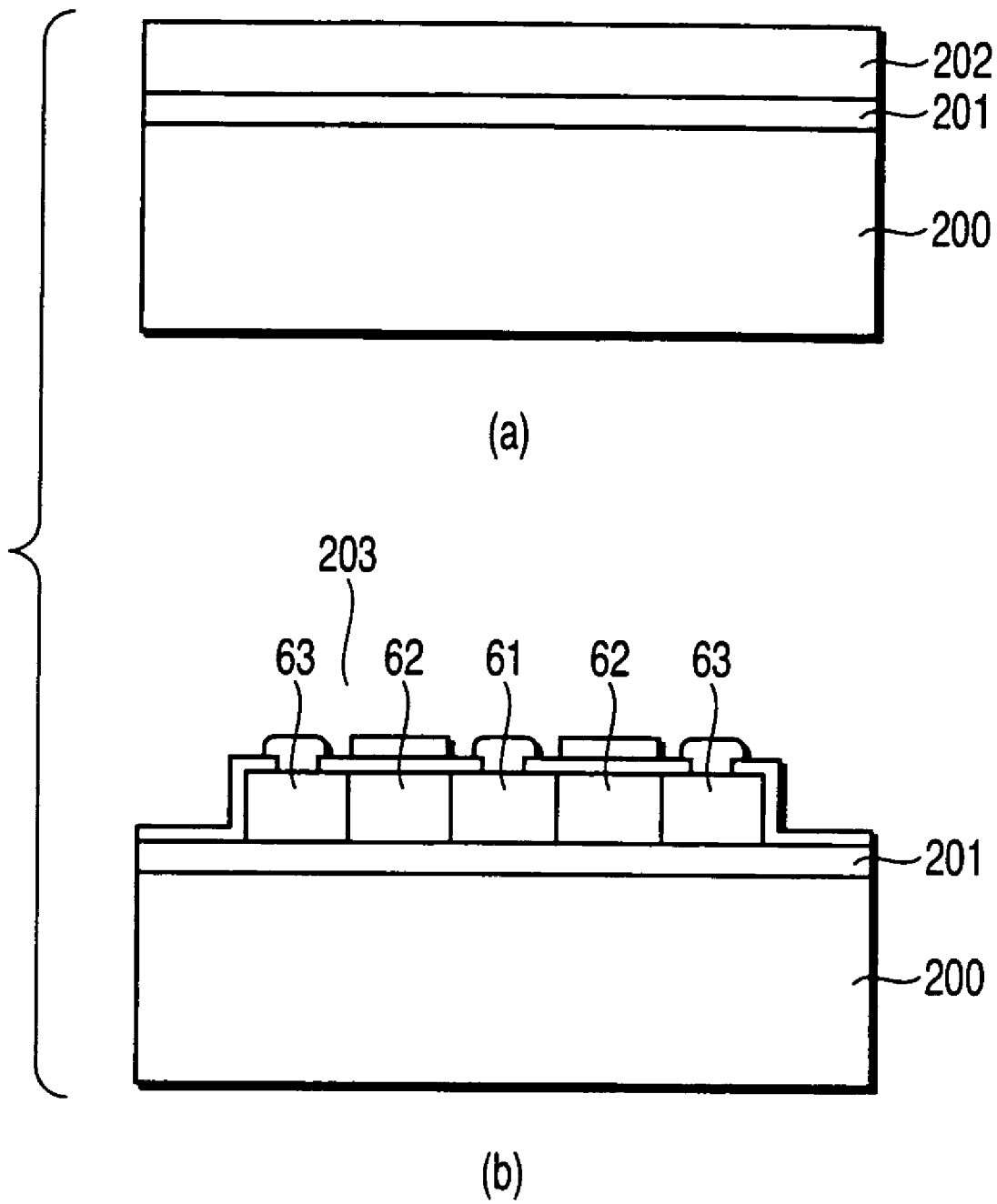
FIG. 17 illustrates a case where a substrate, which is formed by successively forming an insulating layer and a thin-film semiconductor layer on a semiconductor substrate, is used for the formation of the thin-film semiconductor device.

As is shown in FIG. 17A, the present invention may use a substrate which is formed such that an insulating layer 201 is formed on a semiconductor substrate 200 such as a silicon single-crystal substrate, and a thin-film semiconductor 202 is formed on the insulating layer 201. For example, as shown in FIG. 17B, a thin-film transistor 203 (source region 61, channel region 62, drain region 63) can be formed by using this thin-film semiconductor 202.

For instance, $SiO_2$ may be used as the material of the insulating layer 201. In this case, $SiO_2$ can be formed by thermally oxidizing the surface of the silicon substrate 200 or by depositing $SiO_2$ by ordinary CVD (Chemical Vapor Deposition) on the surface of the silicon substrate 200. Examples of usable materials of the thin-film semiconductor are silicon, Group III-V semiconductor materials such as GaAs and other semiconductors. The thin-film semiconductor 202 of, e.g. silicon can be formed by ordinary CVD, vacuum evaporation or sputtering. The methods of forming the insulating layer 201 and thin-film semiconductor 202 are not limited to the above-described ones. The principle of the present invention has been described referring to specific examples. The above description is merely exemplification and, as is obvious, does not limit the technical scope of the present invention.

What is claimed is:

1. A thin-film semiconductor device comprising:
    an island-shaped crystallized thin-film semiconductor layer that is provided on an insulative substrate surface;
    a channel region that is provided in the island-shaped crystallized thin-film semiconductor layer and has a ring shape in a plane;
    one of a source region and a drain region that is provided adjacent to the channel region and inside the ring shape of the channel region in the plane;
    the other of the drain region and the source region that is provided adjacent to the channel region and outside the ring shape of the channel region in the plane;
    a gate insulating film that is provided on the channel region; and
    a gate electrode that is provided on the gate insulating film.

2. The thin-film semiconductor device according to claim 1, wherein the insulative substrate is a glass substrate, a quartz substrate or a plastic substrate.

3. The thin-film semiconductor device according to claim 1, wherein the gate electrode has a ring-shaped structure and is in a circular, elliptical or polygonal shape.

4. A thin-film semiconductor device comprising:
    an insulating layer that is provided on a semiconductor substrate surface;
    an island-shaped crystallized thin-film semiconductor layer that is provided on the insulating layer;
    a channel region that is provided in the island-shaped crystallized thin-film semiconductor layer and has a ring shape in a plane;
    one of a source region and a drain region that is provided adjacent to the channel region and inside the ring shape of the channel region in the plane;
    the other of the drain region and the source region that is provided adjacent to the channel region and outside the ring shape of the channel region in the plane;
    a gate insulating film that is provided on the ring-shaped channel region; and
    a gate electrode that is provided on the gate insulating film.

5. A display device including a plurality of pixels and a plurality of switching elements that control the pixels, wherein the thin-film semiconductor device according to claim 1 or 4 is used as the switching element for each of the pixels.

6. A protection circuit that is connected to an input/output terminal of a semiconductor integrated circuit, which is formed on an insulating substrate, and absorbs a surge current, wherein at least the thin-film semiconductor device according to claim 1 or 4 is used as a structural component of the protection circuit.

7. A CMOS inverter that is formed as a buffer circuit for use in current amplification, wherein at least the thin-film semiconductor device according to claim 1 or 4 is used as a structural component of the CMOS inverter.

8. A thin-film semiconductor device of a MOSFET type, which is formed on an island-shaped crystallized thin-film semiconductor provided on an insulating substrate, comprising:

a source region;
a channel region having a ring shape; and
a drain region, the source region, the channel region and the drain region being adjacent to each other;
a ring-shaped gate insulating film provided on the ring-shaped channel region; and
a ring-shaped gate electrode provided on the ring-shaped gate insulating film,
wherein the channel region is formed of a plurality of single-crystal regions that extend radially from a central part of the thin-film semiconductor device and are defined by crystal grain boundaries.

9. A thin-film semiconductor device according to claim 8, one of the source region and the drain region is formed inside the ring shape of the channel region in the plane, and the other of the drain region and the source region is formed outside the ring shape of the channel region in the plane.

* * * * *